(12) United States Patent
Cabuz

(10) Patent No.: US 6,358,021 B1
(45) Date of Patent: Mar. 19, 2002

(54) ELECTROSTATIC ACTUATORS FOR ACTIVE SURFACES

(75) Inventor: Cleopatra Cabuz, Edina, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/706,051

(22) Filed: Nov. 3, 2000

(51) Int. Cl.⁷ .............................. F04B 17/00; H02N 1/00
(52) U.S. Cl. ................ 417/413.2; 310/309; 251/129.02
(58) Field of Search ........................ 417/413.2, 410.1, 417/413.1, 414, 415; 310/309, 345; 251/129.02

(56) References Cited

U.S. PATENT DOCUMENTS

| | | | | |
|---|---|---|---|---|
| 5,452,878 A | * | 9/1995 | Gravesen et al. | 251/129.02 |
| 5,901,939 A | * | 5/1999 | Cabuz et al. | 251/129.02 |
| 6,215,221 B1 | * | 4/2001 | Cabuz et al. | 310/309 |
| 6,288,472 B1 | * | 9/2001 | Cabuz et al. | 310/309 |

\* cited by examiner

*Primary Examiner*—Teresa Walberg
*Assistant Examiner*—Thor Campbell

(74) *Attorney, Agent, or Firm*—John G. Shudy, Jr.

(57) ABSTRACT

An actuator device controlling the shape of a flexible surface having a quasi-continuum in a plurality of locations. The device includes a plurality of individual cells arranged in an array for contact with the flexible surface. The cells comprise a cell body having an upper film portion and a lower film portion and an open central portion. The upper film portion is in contact with the flexible surface. A post is mounted in the open central portion and fixedly attached to the upper film portion and the lower film portion, the post defining a vertical axis of movement. The upper and lower film portions have electrodes mounted thereon respectively, positioned on the face of the upper and lower film portions and facing each other. A central diaphragm has electrodes on its outer surfaces and an open central portion surrounding the post A power supply operably connected to the electrodes for causing selective cooperative electrostatic activation between them to move the post along the vertical axis to cause the upper film portion to move that portion of the flexible surface in which the upper film portion is in contact. In a preferred embodiment, the cell body has a circular cross section so that the post moves vertically upward and downward to raise or lower the portion of the flexible surface in contact with the upper film portion upon application of electrostatic potential between the electrodes.

12 Claims, 4 Drawing Sheets

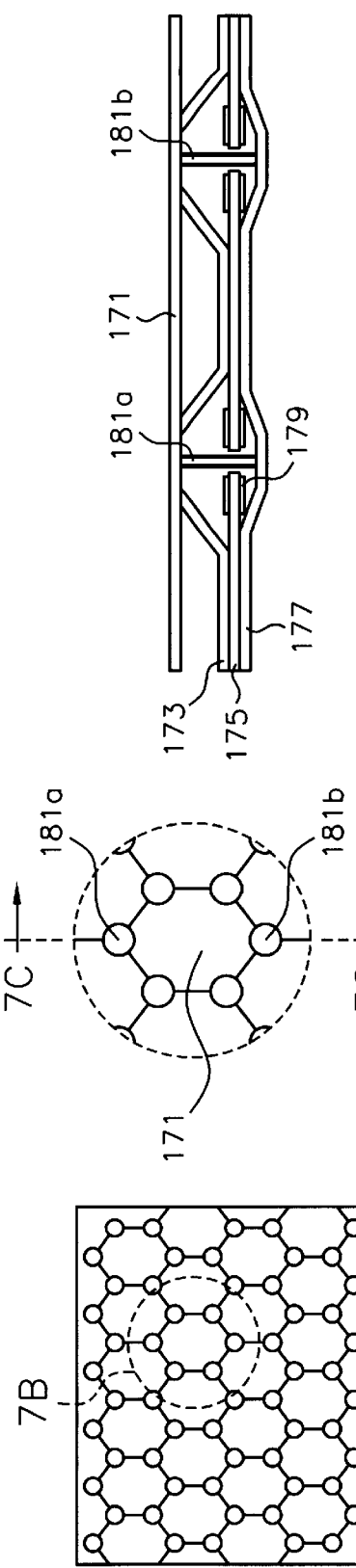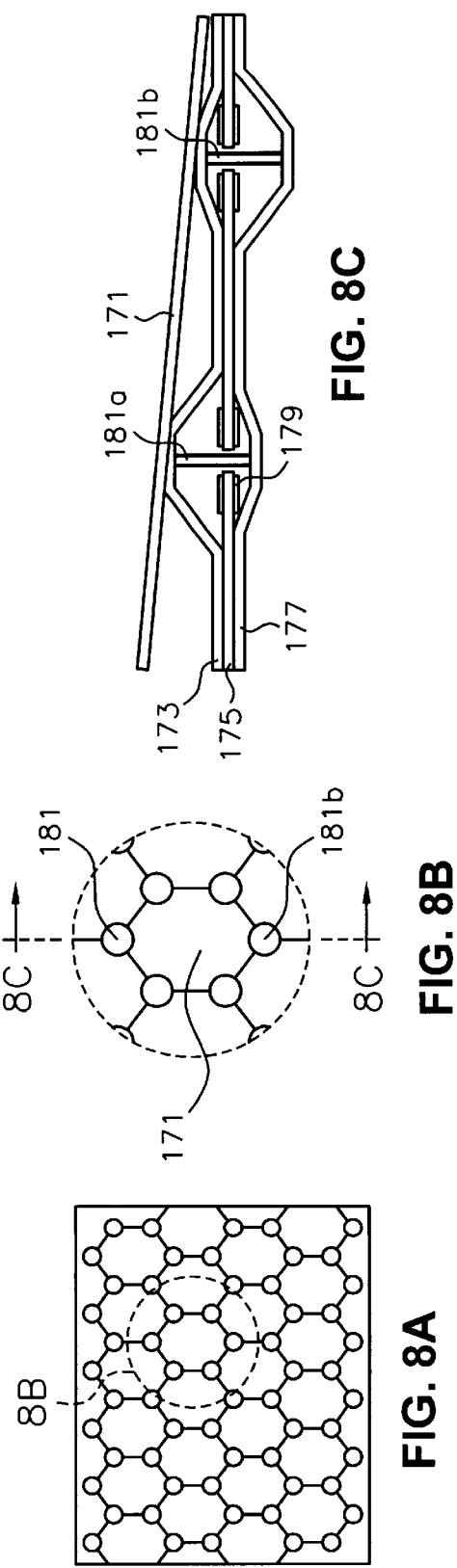

ELECTROSTATIC ACTUATORS FOR ACTIVE SURFACES

FIELD OF THE INVENTION

The present invention relates to localized and global control of relatively large surfaces. More particularly the invention relates to the use of electrostatic actuators and pneumatic action to control the shape of a flexible surface. Specifically the invention relates to a low-weight structure useful in controlling the profile of a surface in large area systems.

BACKGROUND OF THE INVENTION

Activation in two or three dimensional arrays of actuators, particularly where the actuators affect a surface shape over a quasi-continuum, have not been developed to date, even though localized and global shape control of relatively large surfaces would offer significant advantage in various technologies. Examples of these technologies where a significant need exists are, among others, micro adaptive flow control, flight control in micro UAV, acoustics, and drag control.

In order to accomplish the yet to be developed control of surfaces, an actuation principle that allows the actuation of large surfaces with out-of-plane forces is desirable. If there is to be adequate control of small flying objects, simple, light, low power actuators are mandatory. Various actuation devices which affect a surface are known to have drawbacks which prevent their use broadly and certainly limit their use in the various needs described above.

Electromagnetic actuation requires heavy magnetic materials and relatively large currents, and the construction of such devices is not compact enough to be suitable for actuation of large surfaces. Clearly, for flight applications this method is excluded because of poor power/weight performance.

Electrothermally induced actuation is structurally suited for activator arrays, but also has the drawbacks of high power requirements, low speed of response and, in many cases dependence on environmental temperatures. Similarly, piezoelectric actuation, while structurally fitted for actuator arrays and uses low power with adequate or high speed, does not possess the displacements needed and are, in fact, so low as to not be useful for the above considered applications. Piezoelectric materials with increased performance have been proposed, but are both very expensive and heavier than would be acceptable.

In some systems adequate control can be achieved by the use of pneumatic components in the actuation process. In those systems the diaphragms are required to hold a gas inside, requiring adequate thickness to retain the gas, thus leading to heavier films. It would be of particular advantage if a surface shape could be controlled by a device having an array of actuated surfaces which are mechanically controlled, rather than pneumatically actuated, so that thinner and lighter outer surfaces such as membranes could be employed.

In some instances it has been found that the use of the pneumatic component of an electrostatic/pneumatic actuator require relatively thick diaphragm walls, which of course add weight to the device as well. It would be of a significant advantage if a design could be provided which eliminates the need for the diaphragm to hold gas inside.

When combined in an array having a relatively large surface area, it is desirable to have as smooth a surface as possible, for possible use as reflector and antenna applications. This objective would be an advantage in the art if it were to be possible.

It would be of great advantage to the art if a low weight, low power, high performance actuator could be developed which would permit localized and global shape control of relatively large surfaces.

It would be another great advance in the art if actuator arrays could be designed which would permit construction of large two and three dimensional arrays useful in a wide range of applications in flow and sound propagation control.

Other advantages will appear hereinafter.

SUMMARY OF THE INVENTION

It has now been discovered that the above and other advantages of the present invention may be realized in the following manner. Specifically, the present invention comprises a series of electrostatic actuation devices which are admirable suited for building large two and three dimensional arrays of actuators that can cooperate to achieve the advantages of the present invention Extremely simple, the actuator construction of the present invention maybe embedded into the functional device for which it is intended, at a minimum of cost and difficulty. Where a moving surface such as an outer skin of an object is desired, the actuator can be fabricated as the skin. Similarly, where a pump is desired, the actuator becomes the walls of the pump chamber. No additional motors, magnets or high weight power sources are needed. Moreover, the materials required for the electrostatic actuation are conductors for the electrodes and insulators to prevent an electrical short in touch-mode electrostatic actuators, and these materials may be deposited in thin layers over low cost plastic substrates produced by extrusion molding or other methods in desired shapes. The plastic substrates are also available in various off-the-shelf configurations.

The device of this invention broadly comprises a rigid, thin plate with suitable patterned electrodes and embedded circuitry, with a relatively flexible cover. Combined with the plates, the cover creates a cavity that can be sealed. By applying suitable voltages, the shape of the flexible cover can be changed, through the combined effect of electrostatic actuation, built-in elastic force and pneumatic action. Pulling down on the cover in certain areas by electrostatic attraction will result in the displacement of a bubble along the surface, controlled by the pattern of the electrodes and the configuration of the device. Both open and closed cavities are contemplated, as are control of the pressure of the fluid inside the cavity and the magnitude of the built-in elastic force.

Of course, the fluid within the cavity can be a gas or a liquid, depending on the final end use of the product containing the invention. For most flight applications, the fluid will be a gas, while a liquid may be used in other cases such as under water or earth-bound operation.

In a second preferred embodiment, the present invention includes a plurality of individual cells, each cell being operably connected to a large surface area such that the individual cells compound together to provide the desired shape of the large area.

In the most preferred embodiment of this invention, a plurality of cells are provided that include (1) a surface having a shape that is to be controlled, such as a membrane, (2) an underlying infrastructure that supports the top surface in an array of adequately spaced posts, and (3) an actuating mechanism that provides individual control of the vertical position of each supporting post, ensuring control of tilt in each of an array of unit cells.

BRIEF DESCRIPTION OF THE DRAWINGS

For a more complete understanding of the invention, reference is hereby made to the drawings, in which:

FIG. 7a is a side elevational view illustrates a preferred embodiment of this invention in which there is no pneumatic function required for activation, FIG. 7b is an enlargement of the area shown in FIG. 7a, and FIG. 7c is a cross sectional view taken along the line 7C—7C in FIG. 7b;

FIG. 8a is a side elevational view illustrates a preferred embodiment of this invention in which there is no pneumatic function required for activation, FIG. 8b is an enlargement of the area shown in FIG. 8a, and FIG. 8 is a cross sectional view taken along the line 8C—8C in FIG. 8b;

DETAILED DESCRIPTION OF THE PREFERRED EMBODIMENT

The present invention provides an improved actuator for controlling the shape of active surfaces, using a combination of electrostatic and pneumatic forces. A fluid, either liquid or gas, is contained in a cavity or chamber. Liquid fluids are used primarily in water or earth-bound applications, while flight applications will normally use a gas for the fluid. The shape of the chamber is controlled by an electrostatic actuator formed by a base and a cover, such that the cover and base cooperatively function as the actuator when power is supplied to electrodes formed in the base and cover. Attraction of the electrodes during electrostatic actuation causes a change in the shape of the cavity or chamber, thus causing changes in the shape of the active surface.

Figure 1A:
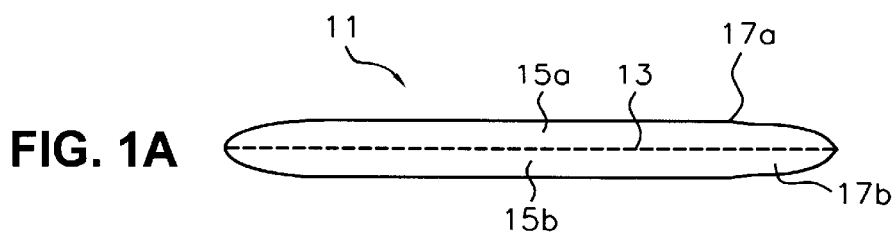
FIGS. 1a, 1b, 1c and id are schematic depictions of the electrostatic/pneumatic actuation of a surface, in accordance with the present invention.
Figure 1B:
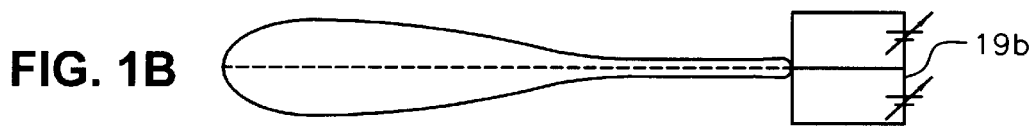

As shown in FIG. 1a, an actuator, 11 generally, comprises a central base 13 and a pair of covers 15a and 15b, each of which covers face inward to the base 13 for providing electrostatic actuator responses with base 13 when power is supplied from a power source. Covers 15a and 15b also form chambers or cavities 17a and 17b, in which is sealed a quantity of gas. In FIG. 1a, there is no actuation in operation and the gas inside cavities 17a and 17b exerts a uniform pressure on all areas of covers 15a and 15b, thus forming a symmetrical shape. In FIG. 1b, actuation of the electrodes on base 13 and covers 15a and 15b at the right end of FIG. 1b in response to power supply 19b has caused the electrodes in these elements to electrostatically attract one another, thus closing the space between electrodes as is accomplished in electrostatic actuators. As a result, the gas in cavities 17a and 17b is pushed to the right hand side of the device. If, for example, the covers 15a and 15b formed part of a surface used in an aircraft over which air passes, thus permitting control of flight in some desired manner.

Figure 1C:
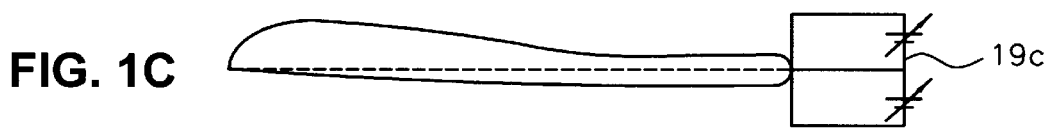
Figure 1D:
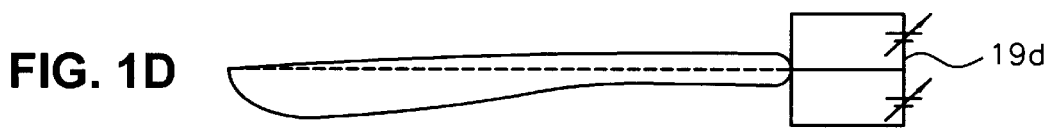
Figures 2A, 2B, 2C:
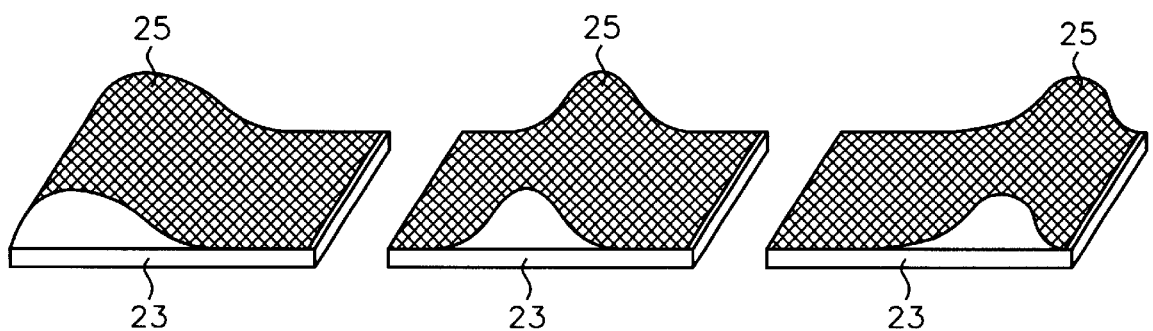
FIGS. 2a, 2b and 2c are a schematic illustration of the action of a surface controlled by the present invention.

In FIG. 1c, only one pair of electrostatic electrodes has been actuated by power supply 19c, thus causing only cavity 17a and therefore cover 15a to be deformed as an active surface. Similarly in FIG. 15d, only cavity 17b has been actuated by power supply 19d, and therefore cover 15b is deformed as an active surface. Clearly, flight can be controlled in a wide variety of manners as surfaces change. For the first time, active surface control for flight surfaces has been achieved with a low cost, light weight, efficient system, as set forth herein. It is a specific embodiment of the present invention to use the activator device herein as a surface in an aircraft. Covers 17 include a lightweight metal frame and thin diaphragm forming the active surface condition during the intended cooperative electrostatic actuation FIGS. 2a, 2b and 2c illustrate the rolling action that is accomplished by the present invention, where electrodes are electrostatically actuated to cause a diaphragm or moving electrode to be attracted to an electrode in the base of the device. When this is accomplished, the fluid will no longer be uniformly distributed in the cavity and balanced with elastic forces of the cover sheet By applying a voltage between cover 25 and base 23 in these FIGS. 2a, 2b and 2c, fluid will be pushed away by the rolling cover, moving from right to left in these figures as shown. In this case the cover 25 can be deflected by its own compressive stress, such as when the cover is buckled, for example.

Figure 3:
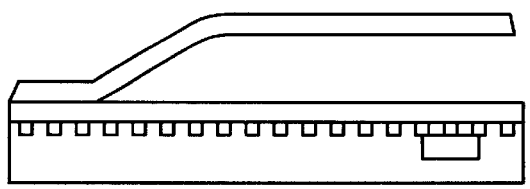
FIG. 3 is a schematic sectional view of part of the surface shown in FIG. 2.

FIG. 3 illustrates some of the details of the electrostatic actuator portion of the present invention. A base 33 is formed from a molded plastic sheet, a light metal frame or other substrate. A pattern array of electrodes 34 are formed on the surface of base 33, in bands, patches with circular or rectangular shapes, or in any shape desired, depending on the desired forces to be applied to the active surface being controlled. Conventional electrostatic actuator control electronics 36 may also be embedded in base 33, and a dielectric 38 applied on top of the array 34 when touch mode actuators are used. Cover 35, which may be formed from a metalized polymer such as a polyester or polyimide, is attached to base 33 so as to define cavity 37, which is then filled with an appropriate fluid.

Figure 4A:
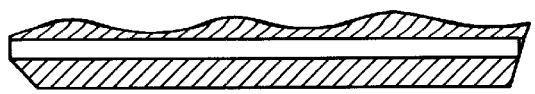
FIGS. 4a, 4b and 4c are schematic, sectional views of a two dimensional array using the electrostatic/pneumatic actuators of the present invention.
Figure 4B:
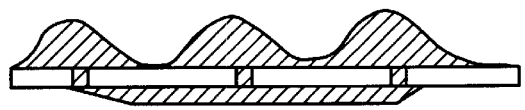
Figure 4C:
Figure 5A:
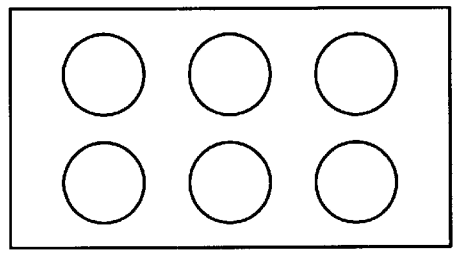
FIGS. 5a and 5b are schematic plan views respectively of circular and rectangular arrays of controlled bubbles.
Figure 5B:
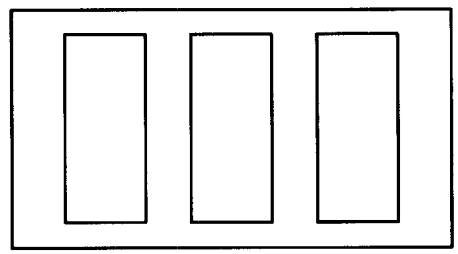

FIGS. 4a, 4b and 4c illustrate the construction of a two dimensional array of a plurality of electrostatic actuators, in which base 43 interacts with various portions of the covers 45a and 45b as illustrated. In this embodiment, fluid passes through openings in base 43 to further provide control of a variety of active surface shapes. FIGS. 5a and 5b illustrate two varieties (of the virtually unlimited choices) for a circular array 54a or a rectangular shaped array 54b.

In all of the devices of this invention, electrostatic activation will cause attraction between the base electrode and the moveable electrode or diaphragm on the cover, thus providing for a controlled adjustment of the shape of the active surface via pneumatic response by the fluid. The pressure in the cavities or chambers acts as an out-of-plane, restoring force to enhance deflection and, also, to fight the known electrostatic actuator phenomenon of stiction. When a pair of actuators is used, such as shown in FIGS. 1a–1d, the camber of a wing can be controlled. Two dimensional arrays of actuators as illustrated for purposes of example herein can be used for active surface control for acoustic purposes, or drag control in other materials. The use of a sealed cavity permits the use of a clean and stable fluid, facilitating the task of the electrostatic actuators associated with the fluid.

Figure 6A:
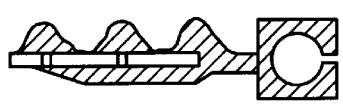
FIGS. 6a, 6b and 6c are schematic, side elevational views of three conditions of pressure control for one embodiment of the present invention, illustrating three operating conditions.
Figure 6B:
Figure 6C:
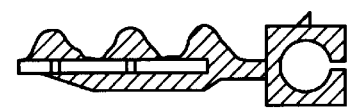

FIGS. 6a, 6b and 6c illustrate the operation of a sealed cavity actuator, which is based on the pressure inside the cavity being slightly higher than the pressure outside the cavity. Of course, temperature variations could affect this balance, such as when a gas is used as the fluid inside the chamber or cavity. One solution to the effect of temperature on the gas inside the cavity is to include a balloon 71 and check valve 73. Balloon 71 expands when the outside pressure is higher than the inside pressure, reducing the enclosed volume and increasing the pressure without air from the outside entering the enclosed cavity. This solution eliminates the need for filters and ensures the proper operation of the electrostatic actuator, by preventing humidity and particles from entering the cavity. When the inside pressure is higher than the outside pressure, the balloon 71 deflates and, if necessary, some gas can leak through a check valve 73.

An alternative embodiment is when the cavity is open to the atmosphere, such as if check valve 73 was eliminated and balloon 71 communicated directly with the outside atmosphere. In this embodiment, the cover such as cover 45 in FIGS. 4a–4c, would be buckled or otherwise out of plane. Application of the electrostatic force will still move the location of the bubble or cavity, changing the overall shape of the envelope defined by cover 45a–45c. In order to demonstrate the efficacy of this concept, an array of doubly supported beams was constructed for silicon microvalve applications. Operation of the active surface control was also achieved on larger area actuators based on molded plastic substrates and diaphragms made out of plastic materials such as polyimides.

Typical but not limiting polymer sheets which may be used in the present invention are flexible and not brittle, properties found in many polymers. One particularly useful polymer is the polyimide sold as KAPTON®, (registered trademark of E. I. du Pont de Nemours & Co., Wilmington, Del.). Others include KALADEX® (registered trademark of ICI Films, Wilmington, Del.) and MYLAR® (registered trademark of E. I. du Pont de Nemours & Co., Wilmington, Del.), or any flexibly elastic polymer that permits it to deform as described herein. Fabrication of the sheets may be based upon technology developed for keyboard and flexible circuits that are produced in huge quantities, although not for electrostatic actuators at this time, making the process well optimized. Preferred sheets are made from polymer films such as KAPTON® or MYLAR® (registered trademark of E. I. du Pont de Nemours & Co., Wilmington, Del.), or different polyesters that are commercially available.

Preferred electrodes are aluminum electrodes deposited directly on the polymer sheets with one or more dielectric films, such as aluminum oxide, or other suitable organic or inorganic dielectrics. Coating layers such as diamond like layers or self assembled monolayers are also contemplated in order to control surface properties. The base plate may be made of molded polymers with embedded electrodes and electronics for localized control. As noted, when flight applications are considered, use of a light metal frame with a thin diaphragm may be used.

In order to obtain the desired dielectric strength, pinhole free dielectric will be used together with specific schemes to locally interrupt the electrode at the location of the pinhole in order to prevent an electrical short This technique is known as a self healing technique. High quality dielectrics on the plastic substrates can be obtained: (a) transfer of LPCVD nitrides or another high quality dielectric from silicon wafers to the base plate by bonding; (b) use of organic dielectrics such as paralyene, acrylates, or polyimides; or (c) the use of inorganic dielectrics deposited at low temperature through ion beam spattering or plasma assisted deposition to increase the dielectric strength.

The mechanical design of the present invention has many forms. Metalized Kapton membranes with thicknesses of 50 to 75 microns have been made, illustrating that electrostatic actuation against pressures of a few psi can be easily achieved when a dielectric with a dielectric strength of more than 2 to 3 Mv/cm is available on the desired area. It is clear the present invention permits the application of envelope control in micro UAV, resulting in full attitude control at a very advantageous power to weight ratio. Simulations have shown attitude control can be achieved with a change in camber of 2% to 4%, which means a change in deflection of about 0.6 to 1.2 mm over a cord of 3 cm, which means the deflections can be easily controlled with the electrostatic pneumatic actuator of this invention.

Turning now to FIGS. 7a, 7b and 7c, and related FIGS. 8a, 8b and 8c, a preferred embodiment is illustrated in which a low-weight structure is used to finely control the profile of a surface in large area systems such as reflector/antenna type applications such as those being proposed for use in space. A top surface 171 includes first film 173, second film 175 and third film 177, which are operably connected to very thin electrodes 179. A supporting post 181 can be raised or lowered to illustrate the movement of surface 171 as shown in the flat and tilted positions. In FIG. 7c, the surface 171 is flat thus being illustrated by its ability to reflect directly impinging light, for example. In FIG. 8c, surface 171 is tilted, having a different reflective reaction to the same impinging light.

Figure 9:
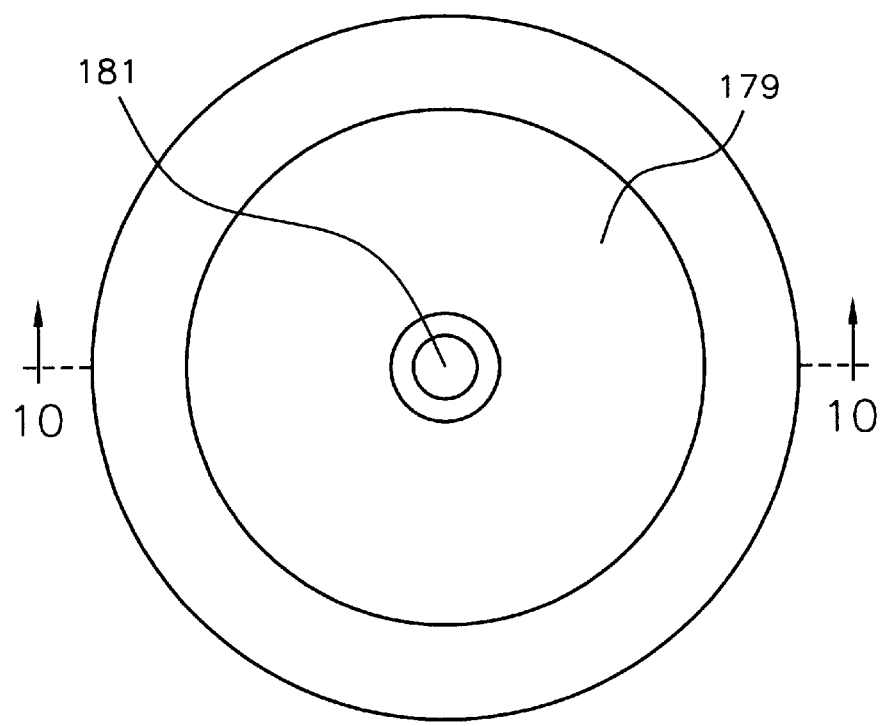
FIG. 9 is a plan view of the device shown in FIGS. 7a–c.
Figure 10:
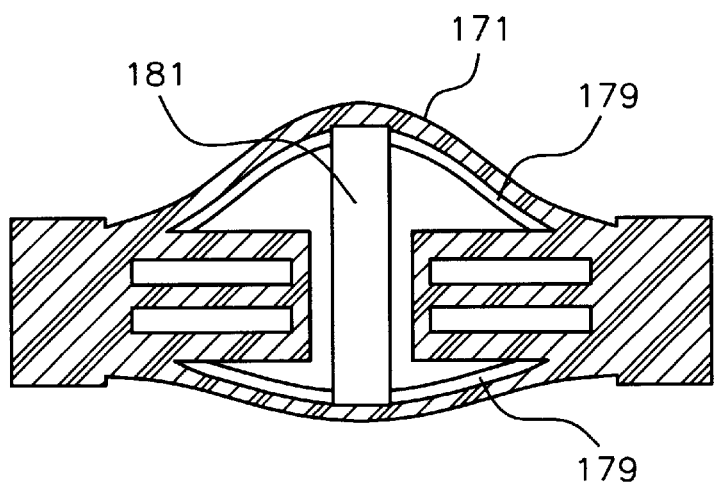
FIG. 10 is a cross section of the driving electrode for the device shown in FIG. 9.

As can be seen, there is no pneumatic component in the actuation process. Rather, the structure employs a central post, shown enlarged in plan view in FIG. 9 and in section along line 10—10 of FIG. 9 in FIG. 10. Because there is a four layer structure, with electrodes 179 on the films 173, 175 and 177, it is easy to electrostatically cause two, three or four layers to move from one position to the other by application of a potential between any two adjacent electrodes. In this manner, the post moves vertically from a first position with no electrostatic force to a second, third and fourth position when some or all the electrodes have been electrostatically actuated. Thus the post allows gradient control over the surface on which it is attached. While FIGS. 9 and 10 illustrate a circular cross section, any other practical mechanical shape can be used, and such modifications are contemplated as part of the present invention.

This invention relates to the use of electrostatic actuator arrays as described above, and any such array technology presently existing to accomplish is combination is contemplated as being within the scope of this invention. The rolling-contact electrostatic actuator principle is described in U.S. Pat. No. 5,836,750.

While particular embodiments of the present invention have been illustrated and described, it is not intended to limit the invention, except as defined by the following claims.

What is claimed is:

1. An actuator device controlling the shape of a flexible surface having a quasi-continuum in a plurality of locations, comprising:

a plurality of individual cells, said cells each being arranged in an array for contact with said flexible surface, said cells comprising:
- a cell body having an upper film portion and a lower film portion, said body further having an open central portion and said upper film portion being in contact with said flexible surface;
- a post mounted in said open central portion and attached to said upper film portion and said lower film portion, said post defining a vertical axis of movement said upper and lower film portions having first and second electrodes mounted thereon respectively, said first and second electrodes being positioned on the face of said upper and lower film portions facing each other;
- a central diaphragm having third and fourth electrodes on the outer surfaces of said diaphragm, said diaphragm having an open central portion surrounding said post;
- a power supply operably connected to said first, second, third and fourth electrodes for causing selective cooperative electrostatic activation between said electrodes to move said post along said vertical axis to cause said upper film portion to move that portion of said flexible surface in which said upper film portion is in contact;
- whereby portions of said flexible surface move in accordance with the activation of each cell to control the shape of said flexible surface in a quasi-continuum.

2. The device of claim 1, wherein said cell body has a circular cross section.

3. The device of claim 1, wherein said post moves vertically upward to raise the portion of said flexible surface in contact with said upper film portion upon application of electrostatic potential between said second and fourth electrodes.

4. The device of claim 1, wherein said post moves vertically downward to lower the portion of said flexible surface in contact with said upper film portion upon application of electrostatic potential between said first and third electrodes.

5. The device of claim 1, wherein said plurality of cells have individual posts of a plurality of lengths, whereby actuation of adjacent cells causes a plurality of changes in said flexible surface.

6. The device of claim 1, wherein said cells are formed from a patterned polyimide having said first, second, third and fourth electrodes embedded therein.

7. An actuator device controlling the shape of a flexible surface having a quasi-continuum in a plurality of locations, comprising:
- a plurality of individual cell means for contact with said flexible surface, said cell means each being arranged in an array for contact with said flexible surface, said cell means comprising:
  - cell body means having an upper film portion means and a lower film portion means for forming the upper and lower portion of said body means, said body means further having an open central portion and said upper film portion means being in contact with said flexible surface;
  - post means mounted in said open central portion and fixedly attached to said upper film portion means and said lower film portion means, said post means defining a vertical axis of movement said upper and lower film portion means having first and second electrode means mounted thereon respectively for electrostatic activation, said first and second electrode means being positioned on the face of said upper and lower film portion means and facing each other;
  - central diaphragm means having third and fourth electrode means on the outer surfaces of said diaphragm means for electrostatic activation, said diaphragm means having an open central portion surrounding said post means;
  - power supply means operably connected to said first, second, third and fourth electrode means for causing selective cooperative electrostatic activation between said electrode means to move said post means along said vertical axis to cause said upper film portion means to move that portion of said flexible surface in which said upper film portion means is in contact;
  - whereby portions of said flexible surface move in accordance with the activation of each cell to control the shape of said flexible surface in a quasi-continuum.

8. The device of claim 7, wherein said cell body means has a circular cross section.

9. The device of claim 7, wherein said post means moves vertically upward to raise the portion of said flexible surface in contact with said upper film portion means upon application of electrostatic potential between said second and fourth electrode means.

10. The device of claim 7, wherein said post moves means vertically downward to lower the portion of said flexible surface in contact with said upper film portion means upon application of electrostatic potential between said first and third electrode means.

11. The device of claim 7, wherein said plurality of cell means have individual post means of a plurality of lengths, whereby actuation of adjacent cell means causes a plurality of changes in said flexible surface.

12. The device of claim 7, wherein said cell means are formed from a patterned polyimide having said first, second, third and fourth electrode means embedded therein.

* * * * *

UNITED STATES PATENT AND TRADEMARK OFFICE
CERTIFICATE OF CORRECTION

PATENT NO. : 6,358,021 B1
DATED : March 19, 2002
INVENTOR(S) : Cleopatra Cabuz

Page 1 of 1

It is certified that error appears in the above-identified patent and that said Letters Patent is hereby corrected as shown below:

<u>Title page,</u>
Item [60], should read -- This is a continuation-in-part of application Serial No. 09/223,083, filed December 29, 1998. --

Signed and Sealed this

Fifteenth Day of April, 2003

JAMES E. ROGAN
*Director of the United States Patent and Trademark Office*